United States Patent
Bustamante et al.

(10) Patent No.: US 10,753,009 B2
(45) Date of Patent: Aug. 25, 2020

(54) LOCALIZING NANOPORE FABRICATION ON A MEMBRANE BY LASER ILLUMINATION DURING CONTROLLED BREAKDOWN

(71) Applicant: THE UNIVERSITY OF OTTAWA, Ottawa (CA)

(72) Inventors: Jose Bustamante, Ottawa (CA); Kyle Briggs, Ottawa (CA); Vincent Tabard-Cossa, Ottawa (CA)

(73) Assignee: THE UNIVERSITY OF OTTAWA, Ottawa (CA)

(*) Notice: Subject to any disclaimer, the term of this patent is extended or adjusted under 35 U.S.C. 154(b) by 483 days.

(21) Appl. No.: 15/552,534

(22) PCT Filed: Feb. 24, 2016

(86) PCT No.: PCT/IB2016/051017
§ 371 (c)(1),
(2) Date: Aug. 22, 2017

(87) PCT Pub. No.: WO2016/135656
PCT Pub. Date: Sep. 1, 2016

(65) Prior Publication Data
US 2018/0043310 A1 Feb. 15, 2018

Related U.S. Application Data
(60) Provisional application No. 62/120,054, filed on Feb. 24, 2015.

(51) Int. Cl.
*C25F 3/02* (2006.01)
*C25F 7/00* (2006.01)
(Continued)

(52) U.S. Cl.
CPC ............ *C25F 3/02* (2013.01); *B01D 65/02* (2013.01); *B01D 67/006* (2013.01);
(Continued)

(58) Field of Classification Search
CPC ............ B01D 67/006; B01D 2323/34; B01D 2323/35; B23K 26/384; B23K 26/40; C25F 3/02; C25F 7/00
See application file for complete search history.

(56) References Cited

U.S. PATENT DOCUMENTS

| | | | |
|---|---|---|---|
| 2012/0103821 A1 | 5/2012 | Harrer et al. | |
| 2013/0011656 A1* | 1/2013 | Zhang | C30B 33/10 428/312.8 |

(Continued)

FOREIGN PATENT DOCUMENTS

| | | |
|---|---|---|
| CN | 104109633 A | 10/2014 |
| JP | 63092025 A * | 4/1988 |

(Continued)

OTHER PUBLICATIONS

Sergii Pud et al "Self-Aligned Plasmonic Nanopores By Optically Controlled Dielectric Breakdown", Nano Letters, vol. 15, No. 10 (Oct. 2015).

(Continued)

*Primary Examiner* — Nicholas A Smith
(74) *Attorney, Agent, or Firm* — Harness, Dickey & Pierce, P.L.C.

(57) ABSTRACT

A method for fabricating a nanopore at a particular location in a membrane includes controlling a dielectric strength of the membrane at a particular location on the membrane while applying one of an electric potential or an electric current to the membrane, monitoring an electrical property across the membrane while one of the electric potential or the electric current is being applied across the membrane,
(Continued)

detecting an abrupt change in the electrical property across the membrane while one of the electric potential or the electric current is being applied across the membrane; and removing the electric potential or the electric current from the membrane in response to detecting the abrupt change in the electrical property.

30 Claims, 5 Drawing Sheets

(51) Int. Cl.
  *B23K 26/40* (2014.01)
  *B01D 71/02* (2006.01)
  *B01D 67/00* (2006.01)
  *B23K 26/384* (2014.01)
  *B01D 65/02* (2006.01)
  *B81B 1/00* (2006.01)

(52) U.S. Cl.
  CPC ......... *B01D 67/0032* (2013.01); *B01D 71/02* (2013.01); *B23K 26/384* (2015.10); *B23K 26/40* (2013.01); *B81B 1/002* (2013.01); *C25F 7/00* (2013.01); *B01D 2321/22* (2013.01); *B01D 2323/34* (2013.01); *B01D 2323/35* (2013.01); *B01D 2325/02* (2013.01); *B01D 2325/26* (2013.01)

(56) References Cited

U.S. PATENT DOCUMENTS

2015/0108008 A1  4/2015  Kwok et al.
2015/0109008 A1  4/2015  Godin et al.

FOREIGN PATENT DOCUMENTS

| JP | H0674899 A | | 3/1994 |
| JP | H0674899 B2 | * | 9/1994 |
| JP | 2004-148458 A | | 5/2004 |
| JP | 2004148458 A | * | 5/2004 |
| JP | 63-92025 B2 | | 9/2018 |
| WO | WO-2005017025 A2 | | 2/2005 |
| WO | WO-2013167952 A1 | | 11/2013 |
| WO | WO-2013167955 A1 | | 11/2013 |
| WO | WO-2014153047 A1 | | 9/2014 |

OTHER PUBLICATIONS

Tal Gilboa et al "Optically-Monitored Nanopore Fabrication Using A Focused Laser Beam", Scientific Reports, vol. 9, No. 1 (Jun. 2018).
U.S. Appl. No. 14/399,071.
U.S. Appl. No. 14/399,091.
International Search Report and Written Opinion of the International Searching Authority issued in PCT/IB2016/051017, dated May 10, 2016, ISA/CA.
Kwok, H. et al.: "Nanopore Fabrication by Controlled Dielectric Breakdown", PLOS One 9(3): e92880 (2014).
Beamish, E. et al.: "Precise control of the size and noise of solid-state nanopores using high electric fields": Nanotechnology 23, 405301, 7 pages (2012); http://dx.doi.org/10.1088/0957-4484/23/40/405301.
Office Action issued in Chinese Application No. 2016800228231, dated Mar. 16, 2020.
Office Action issued in Japanese App. No. 2017-544630, dated Feb. 4, 2020.
English translation of ISR issued in Chinese App. No. 2016800228231, dated Mar. 6, 2020.

* cited by examiner

| Material | Wavelength |
|---|---|
| SiCN | 326nm |
| β- $C_3N_4$ | 388nm |
| β- $Si_3N_4$ | 295nm<br>250nm |
| α- $Si_3N_4$ | 268nm |
| $Si_3N_4$ | 234nm |
| $HfO_2$ | 214nm<br>218nm |
| $SiO_2$ | 138nm |
| α- $SiO_2$ | 222nm |
| $SiN_x$ (non-stoichiometric silicon nitride) | 269nm-1127nm depending on x |

FIG. 4

LOCALIZING NANOPORE FABRICATION ON A MEMBRANE BY LASER ILLUMINATION DURING CONTROLLED BREAKDOWN

CROSS-REFERENCE TO RELATED APPLICATIONS

This application is a 371 National Phase of PCT/162016/051'01.7 filed Feb. 24, 2016 and published in English as WO 2016/135656 A1 on Sep. 1, 2016, which claims the benefit of U.S. Provisional Application No. 62/120,054, filed on Feb. 24, 2015. The entire disclosures of the above applications are incorporated herein by reference.

FIELD

The present disclosure relates to fabrication of a nanopore on a membrane.

BACKGROUND

One nanofabrication technique may include a controlled breakdown (CBD) of a thin solid-state membrane to form nanopores in the membrane at the nanoscale. The technique employs a high electric field (e.g., ~1V/nm) that is applied across the membrane, which is immersed in an electrolyte solution. The presence of a tunneling current through the membrane induced by the high electric field leads to the formation of locally conductive defects at hotspots on the membrane, and causes a breakdown when a connected path of such defects exists across the membrane. The by-product of the breakdown reaction is easily removed by the fluid, and the formation of an individual nanopore is indicated by a sudden increase in the level of current measured through the membrane, or the appearance of an ionic current at low electric field strength (e.g., ~0.01V/nm, values at which the rest of the membrane is insulating).

Using the CBD based technique, nanopores as small as 1-nm in diameter can be made, and can be further enlarged using moderate electric fields with sub-nm precision. The field can be applied continuously or pulsed between high and low values during fabrication. Further details regarding the CBD technique may also be found in Kwok, H.; Briggs, K; and Tabard-Cossa, V.; "*Nanopore Fabrication by Controlled Dielectric Breakdown*"—PLoS ONE 9(3): e92880 (2014) and in U.S. patent application Ser. No. 14/399,071 entitled "Fabrication of Nanopores using High Electric Fields" which is incorporated in its entirety herein by reference. Details regarding enlarging the nanopores can be found in Beamish, E.; Kwok, H.; Tabard-Cossa, V.; and Godin, M.; "*Precise control of the size and noise of solid-state nanopores using high electric fields*"—Nanotechnology 23, 405301, 7 pages (2012), and in U.S. patent application Ser. No. 14/399,091 entitled "Method for controlling the size of solid-state nanopores" which is incorporated herein by reference.

The fabrication process using the CBD technique can be stochastic, both in terms of the time-to-breakdown and the location of the nanopore on the membrane. For instance, only one nanopore is formed as long as the electric field is terminated quickly enough after pore fabrication and the location of the nanopore on the membrane can be random. For some applications, such as those involving nano-electrodes that measure transverse tunneling current, nanostructures on the membrane surface that control capture and/or passage of biomolecules, or for experiments involving optical detection, precise localization of the nanopore may be important. Thus, the CBD technique may be difficult to implement.

This section provides background information related to the present disclosure which is not necessarily prior art.

SUMMARY

This section provides a general summary of the disclosure, and is not a comprehensive disclosure of its full scope or all of its features. The present disclosure is generally directed toward a method for fabricating a nanopore at a particular location in a membrane. The method includes: controlling a dielectric strength of the membrane at a particular location on the membrane while applying one of an electric potential or an electric current to the membrane; monitoring an electrical property across the membrane while one of the electric potential or the electric current is being applied across the membrane; detecting an abrupt change in the electrical property across the membrane while one of the electric potential or the electric current is being applied across the membrane; and removing the electric potential or the electric current from the membrane in response to detecting the abrupt change in the electrical property.

In an aspect of the present disclosure, the controlling dielectric strength of the membrane may further comprise directing a laser beam onto the particular location on the membrane.

In another aspect of the present disclosure, the method may further include removing the laser beam from the particular location on the membrane in response to detecting the abrupt change in the electrical property across the membrane.

In yet another aspect of the present disclosure, the one of the electric potential or the electric current may be applied after the laser beam is directed onto the particular location on the membrane.

In an aspect of the present disclosure, the laser beam may be directed onto the particular location on the membrane after the one of the electric potential or the electric current is applied In another aspect of the present disclosure, the method may further include directing the laser beam onto a second location on the membrane, thereby forming a second nanopore in the membrane, where the second location differs from the particular location.

In yet another aspect of the present disclosure, with an electric potential being applied to the membrane, the electrical property being monitored is a leakage current, and the detecting the abrupt change in the electrical property may further include detecting an abrupt increase in the leakage current across the membrane.

In an aspect of the present disclosure, in detecting the abrupt increase in the leakage current, the method may further include determining a rate of change of the leakage current and comparing the rate of change to a threshold. The electric potential is removed when the rate of change of the leakage current is greater than the threshold, thereby stopping the fabrication of a nanopore.

In another aspect of the present disclosure, in detecting he abrupt increase in the leakage current, the method may further include comparing a value of the leakage current to a threshold. The electric potential is removed when the value of the leakage current is greater than the threshold, thereby stopping the fabrication of a nanopore.

In yet another aspect of the present disclosure, with an electrical current being applied to the membrane, the electrical property being monitored is a voltage across the membrane, and the detecting the abrupt change in the electrical property may further include detecting an abrupt decrease in the voltage across the membrane.

In an aspect of the present disclosure, the method may further include: disposing the membrane between two reservoirs filled with a fluid containing ions, such that the membrane separates the two reservoirs and prevents the fluid from passing between the two reservoirs; placing an electrode into each of the two reservoirs; and generating the one of the electric potential or the electric current using the electrodes.

In another aspect of the present disclosure, the method may further include: disposing the membrane between two reservoirs filled with a fluid containing ions, such that the membrane separates the two reservoirs and prevents the fluid from passing between the two reservoirs; placing an electrode in direct contact with the membrane; and the one of the electric potential or the electric current using the electrodes.

In an aspect of the present disclosure, the present disclosure is generally directed to a method for fabricating a nanopore at a particular location in a membrane, where the method includes: directing a laser beam from a light source onto a surface of the membrane at the particular location on the membrane, where the membrane is comprised of at least one dielectric material; applying one of an electric potential or an electric current to the membrane; measuring an electrical property across the membrane while the one of the electric potential or the electric current is being applied to the membrane and the laser beam is being directed at the particular location, where the electrical property includes at least one of voltage or leakage current; comparing value of the measured electrical property to a threshold; and removing the one of the electric potential or the electric current to the membrane and removing the laser beam from the particular location on the membrane in response to the value of the measured electrical property exceeding the threshold.

In an aspect of the present disclosure, the method may further include selecting a wavelength for the laser beam based on material composition of the membrane.

In an aspect of the present disclosure, the electrical property includes the leakage current across the membrane when an electrical potential is applied to the membrane, and the comparing value of the measured electrical property further comprises determining a rate of change of the leakage current and comparing the rate of change, as the value, to the threshold. The electric potential and the laser beam are removed when the rate of change of the leakage current is greater than the threshold, thereby stopping the fabrication of a nanopore.

In another aspect of the present disclosure, the electrical property includes the leakage current across the membrane when an electrical potential is applied to the membrane, and the electric potential and the laser beam are removed when the value of the leakage current is greater than the threshold, thereby stopping the fabrication of the nanopore.

In yet another aspect of the present disclosure, the electrical property includes the voltage across the membrane when an electrical current is applied to the membrane, and the electrical current and the laser beam are removed when the value of the voltage is less than the threshold, thereby stopping the fabrication of the nanopore.

In an aspect of the present disclosure, to form a plurality of the nanopores at predetermined locations on the membrane, at each of the predetermined locations, the laser beam is directed onto the surface of the membrane at the predetermined location on the membrane, the one of the electric potential or the electric current is applied to the membrane, the electrical property across the membrane is measured while the one of the electric potential or the electric current is being applied to the membrane and the laser beam is being directed at the predetermined location, the measured electrical property is compared to the threshold, and the one of the electric potential or the electric current and the laser beam are removed in response to the value of the measured electrical property exceeding the threshold.

In another aspect of the present disclosure, in directing the laser beam, the method may further include controlling a positional alignment between the membrane and the laser beam by controlling an optical direction of the laser beam, and activating the light source to emit the laser beam toward the surface of the membrane at the particular location on the membrane.

In yet another aspect of the present disclosure, in directing the laser beam, the method may further include controlling a positional alignment between the membrane and the laser beam by adjusting a position of the membrane with respect to the light source, and activating the light source to emit the laser beam toward the surface of the membrane at the particular location on the membrane.

In an aspect of the present disclosure, the present disclosure is generally directed toward an apparatus for fabricating a nanopore in a membrane that is comprised of at least one dielectric material. The apparatus may include a fluidic device, an optical device, a sensor, and a controller. The fluidic device may include two reservoirs, at least two electrodes, and a holder. The reservoirs hold fluid that contains ions, and the membrane separates the two reservoirs and prevents the fluid from passing between the two reservoirs. The electrodes are electrically connected to a power source and are operable to apply one of an electric potential or an electric current to the membrane. The holder is configured to hold the membrane that is immersed in the fluid from the two reservoirs and includes a window that provides optical access to the membrane.

The optical device may be operable to emit a focused laser beam passing through the window of the holder and directed toward a particular location on the membrane. The focused laser beam illuminates the particular location of the membrane as the one of the electric potential or the electric current is being applied to the membrane by the electrodes.

The sensor may be electrically coupled to one of the electrodes and may be operable to measure an electrical property across the membrane. The electrical property may include at least one of voltage and leakage current.

The controller may interface with the sensor and detect an abrupt change in the measured electrical property. In response to detecting the abrupt change in the measured electrical property, the controller may remove the one of the electric potential or the electric current applied to the membrane and remove the focused laser beam from the particular location on the membrane.

In another aspect of the present disclosure, the optical device is an inverted optical microscope.

In yet another aspect of the present disclosure, one electrode of the at least two electrodes is disposed in each of the two reservoirs.

In an aspect of the present disclosure, the at least two electrodes are in direct contact with the membrane.

In another aspect of the present disclosure, the electrodes may apply an electric current to the membrane, the sensor may measure a voltage across the membrane, as the electrical property, and the controller may compare the measured voltage to a threshold and remove the electric current to the membrane and the focused laser beam from the particular location on the membrane in response to the voltage being less than the threshold.

In yet another aspect of the present disclosure, the electrodes may apply an electric potential to the membrane, the sensor may measure a leakage current across the membrane, as the electrical property, and the controller may compare the measured leakage current to a threshold. The controller may remove the electric potential to the membrane and the focused laser beam from the particular location on the membrane in response to the measured leakage current being greater than the threshold.

In an aspect of the present disclosure, the present disclosure is generally directed to a method of increasing size of a nanopore in a membrane comprising at least one dielectric material, where the method includes: directing a laser beam onto the nanopore in the membrane while one of an electric potential or an electric current is applied to the membrane; measuring a leakage current across the membrane; determining an increase in size of the nanopore based on the measured leakage current; and removing the one of the electric potential or the electric current to the membrane in response to detecting an increase in size of the nanopore.

In an aspect of the present disclosure, the membrane comprises a plurality of nanopores and the laser beam is directed onto a first nanopore.

In another aspect of the present disclosure, the method may further include directing the laser beam onto a second nanopore.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 4 is a table listing multiple membrane materials and the associated wavelength for a light beam to be illuminated on the membrane

Corresponding reference numerals indicate corresponding parts throughout the several views of the drawings.

DETAILED DESCRIPTION

The present disclosure describes a method and/or apparatus for fabricating nanopores at a predetermined location using a laser-enhanced controlled breakdown (LECBD) technique. The LECBD technique controls a dielectric strength of the membrane material to significantly enhance the likelihood of fabricating a nanopore at a precise location on the membrane. Using LECBD, a focused light beam (e.g., a laser beam) is directed toward and illuminates the membrane at a particular location. With the particular location illuminated, an electric potential is applied across the membrane. The focused beam increases the conductivity at the particular location. The increased conductivity results in locally enhanced leakage current and strongly favors nanopore formation in the illuminated portion of the membrane.

The present disclosure will now be described more fully with reference to the accompanying drawings.

Figure 1:
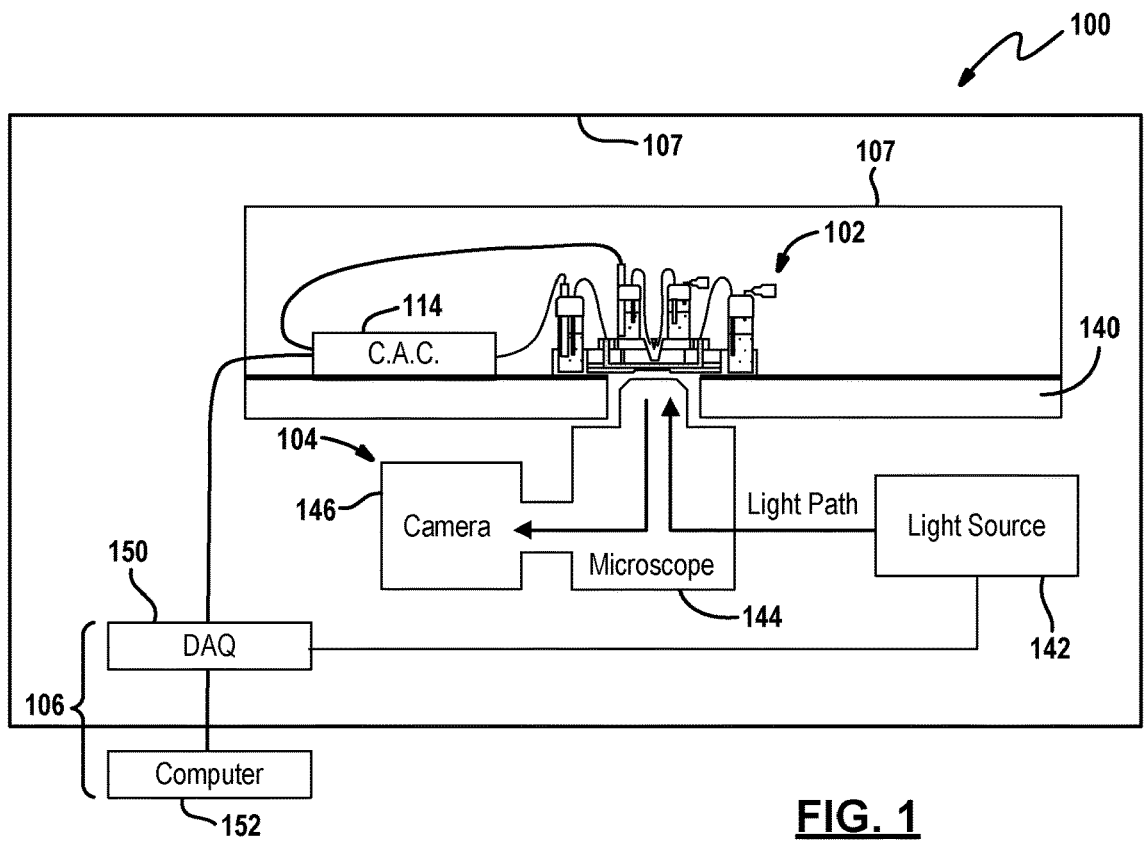
FIG. 1 is a diagram depicting an example setup for fabricating a nanopore using a laser-enhanced controlled breakdown technique of the present disclosure.
Figure 2:
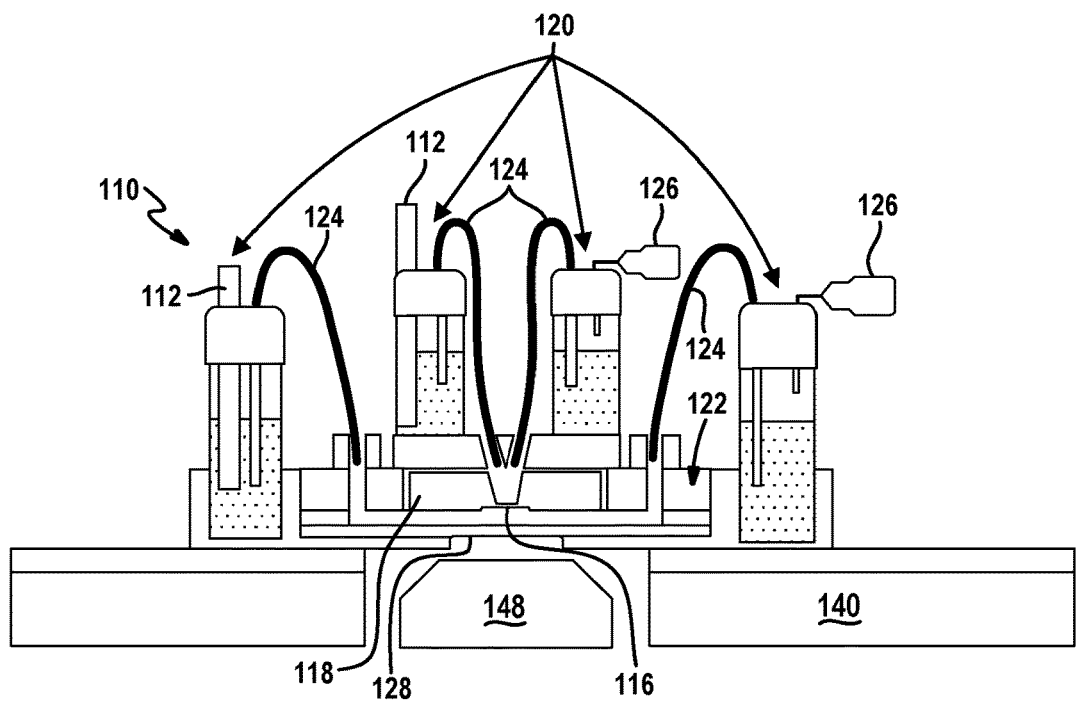
FIG. 2 is an expanded view of a fluidic device in the setup of FIG. 1.

FIGS. 1 and 2 depict an example of a nanopore fabrication apparatus for fabricating a nanopore using LECBD. The nanopore fabrication apparatus 100 includes a fluidic device 102, a focus beam device 104 (i.e., an optical device), and a controller 106. The fluidic device 102 and/or the entire apparatus can be disposed in a grounded faraday cage 107 to isolate electric noise. The setup, used to demonstrate localization of the nanopore fabrication by LECBD, is designed for performing simultaneous optical and electrical measurements of biomolecule passage through the nanopore; though simpler embodiments can be constructed to implement LECBD.

As illustrated in FIG. 2, the fluidic device 102 includes a fluidic cell 110 and a pair of electrodes 112 electrically coupled to a current amplifier circuit (CAC) 114. The fluidic cell 110 holds a membrane 116 disposed in a silicon chip 118 and provides an optical access to the membrane 116 for the focus beam device 104.

In some implementations, the membrane 116 is comprised of a dielectric material such as silicon nitride (SiN). Membranes are preferably thin with a thickness of 10 nm or 30 nm; although membranes having different thicknesses are contemplated by this disclosure. Membranes comprised of other dielectric materials, such as other oxides and nitrides, which are commonly used as gate materials for transistors, also fall within the scope of this disclosure. Likewise, atomically thin membranes may be comprised of other materials such as graphene, boron nitride and the like. It is also contemplated that the membranes may be comprised of multiple layers of materials, including dielectric materials and/or conductive materials.

The fluidic cell 110 includes reservoirs 120 and a holder 122. The reservoirs 120 are filled with a fluid containing ions (i.e., electrolyte solution). Fluid is provided from the reservoirs 120 to the membrane 116 by way of polytetrafluoroethylene (PTFE) tubing 124. The electrodes 112 are inserted into the respective reservoirs 120 and are electrically linked to the membrane 116 through the electrolyte solution flowing from the reservoirs 120 through the PTFE tubing 124. The flow of the electrolyte solution from the reservoirs 120 may be controlled by connecting a syringe pump (not shown) to a needle-hub member 126 provided with the reservoirs 120.

The fluidic device 102 may include various suitable combination of electrodes and electrolyte solution. For example, the fluidic device 102 may have chloride-based salt solutions with Ag/AgCl electrodes or a copper sulphate solutions with copper electrodes. The fluid could also be a non-aqueous solvent, such as 1M LiCl in ethanol. The fluid can be the same in both reservoirs 120 and does not need to possess an active etching action against the membrane material. Other types of fluids and means of positioning the membrane between the two reservoirs are also envisioned, such as micro- and nanofluidics encapsulation.

The holder 122 houses the membrane 116 and immerses the membrane 116 with fluid from the reservoirs 120. The holder 122 may be made of aluminum or other suitable material. The holder 122 also includes a window 128 for providing an optical access to the focus beam device 104. More particularly, a particular location of the membrane 116 at which a nanopore is to be formed is arranged within the window 128 to receive a focus beam from the focus beam device 104.

The fluidic device 102 is positioned on a stage 140 over the focus beam device 104. The stage 140 may be a fixed stage or a moveable stage. The focus beam device 104 may be an inverted optical microscope and includes a light source 142, a microscope 144, and a camera 146. The light source 142 may be operable by the controller 106 for activating and deactivating the light source 142 and/or controlling a shutter member (not shown) that blocks the light emitted by the focus beam device 104. In an example embodiment, the light source 142 may be a laser diode that emits a laser beam at a desired wavelength. The light source 142 may include other suitable sources, such as a mercury lamp, and is not limited to the examples provided herein.

The light generated by the light source 142 is directed through the microscope 144 where it is focused by adjusting a distance between two lenses (not shown) and is directed toward the membrane 116. Specifically, an objective 148 of the microscope 144 aligns with the window 128 of the fluidic device 102. The light beam is directed to a particular location of the membrane 116 at which the nanopore is to be formed. For example, the controller 106 may control the focus beam device 104 to adjust the direction of the light beam to have the light beam align with the particular location along the membrane 116. As another example, if the stage 140 is moveable, the controller 106 may also adjust the position of the membrane 116 with respect to the light beam by controlling the stage 140. Other methods for aligning the light beam with the membrane at the particular location are also envisioned, such as controlling both the focus beam device and the position of the membrane, and therefore, the present disclosure should not be limited to the examples provided herein.

The light beam emitted from the microscope 144 illuminates the particular location of the membrane 116 and may illuminate fluorophores (e.g. YOYO stained DNA, or $Ca^{2+}$ sensitive dyes). The emission is filtered by a specific filter cube inside the microscope 144 (e.g. FITC) and collected by the camera 146.

With the light beam illuminating the membrane 116 at the particular location, the controller 106 may control the current amplifier circuit 114 and have the circuit 114 apply an electrical potential to the electrodes 112. In an example embodiment, the controller 106 may be implemented by a data acquisition (DAQ) circuit 150 coupled to a personal computer 152 or another type of computing device.

The current amplifier circuit 114 may be a simple operation-amplifier circuit to read and control voltage and current. Operational-amplifiers may be powered by, for example, a ±20 volt voltage source. In operation, the circuit 114 takes in a command voltage (e.g. between ±10 volts) from the controller 106, amplifies the command voltage to, for example, ±20 volts, and sets the potential across the membrane 116 by way of the electrodes 112. The applied potential can also be measured by the current amplifier circuit 114. For instance, current flow between the two electrodes 112 is measured at one or both of the electrodes 112 with pA sensitivity. More specifically, current is measured with a transimpedance amplifier topology. The measured current signal is digitized by the data acquisition circuit 150 and fed continuously into the computer 152. In this way, the current is monitored in real time by the controller 106 (e.g., at a frequency of 10 Hz). Other circuit arrangements for applying a potential and measuring a current fall within the scope of this disclosure.

The controller 106 monitors the current between the electrodes 112 and determines when the current reaches a current threshold. In the example embodiment, the current threshold is set to coincide with the sudden increase in current as to set the minimal size of the nanopore on the order of 1-nm. In other embodiments, the size of the nanopore can be set larger by continuing to apply a potential across the membrane. That is, the size of the nanopore continues to increase as the monitored current continues to increase. Rather than setting the current threshold to coincide with the sudden increase in the leakage current, the value of the current threshold may be set to different values to achieve a nanopore of varying sizes.

In the example embodiment the formation of the nanospore is monitored by applying a fixed voltage and monitoring the current. Alternatively, the nanopore fabrication apparatus 100 may be configured to apply a fixed current level and to monitor the voltage across the membrane 116. For example, with a fixed current being applied to the membrane 116, the controller 106 may monitor the voltage across membrane to detect an abrupt decrease in voltage caused when a nanopore is formed. This abrupt decrease in voltage self-limits the enlargement of the newly formed pore. The controller 106 may compare the detected voltage with a voltage threshold that coincides with the sudden decrease in voltage for setting the minimal size of the nanopore. Accordingly, in an example embodiment, the current amplifier circuit may operate as a sensor to measure an electrical property, such as current and/or voltage. The controller may receive an electrical signal from the current amplifier circuit indicative of the electrical property measured across the membrane to monitor the electrical property.

Figure 3:
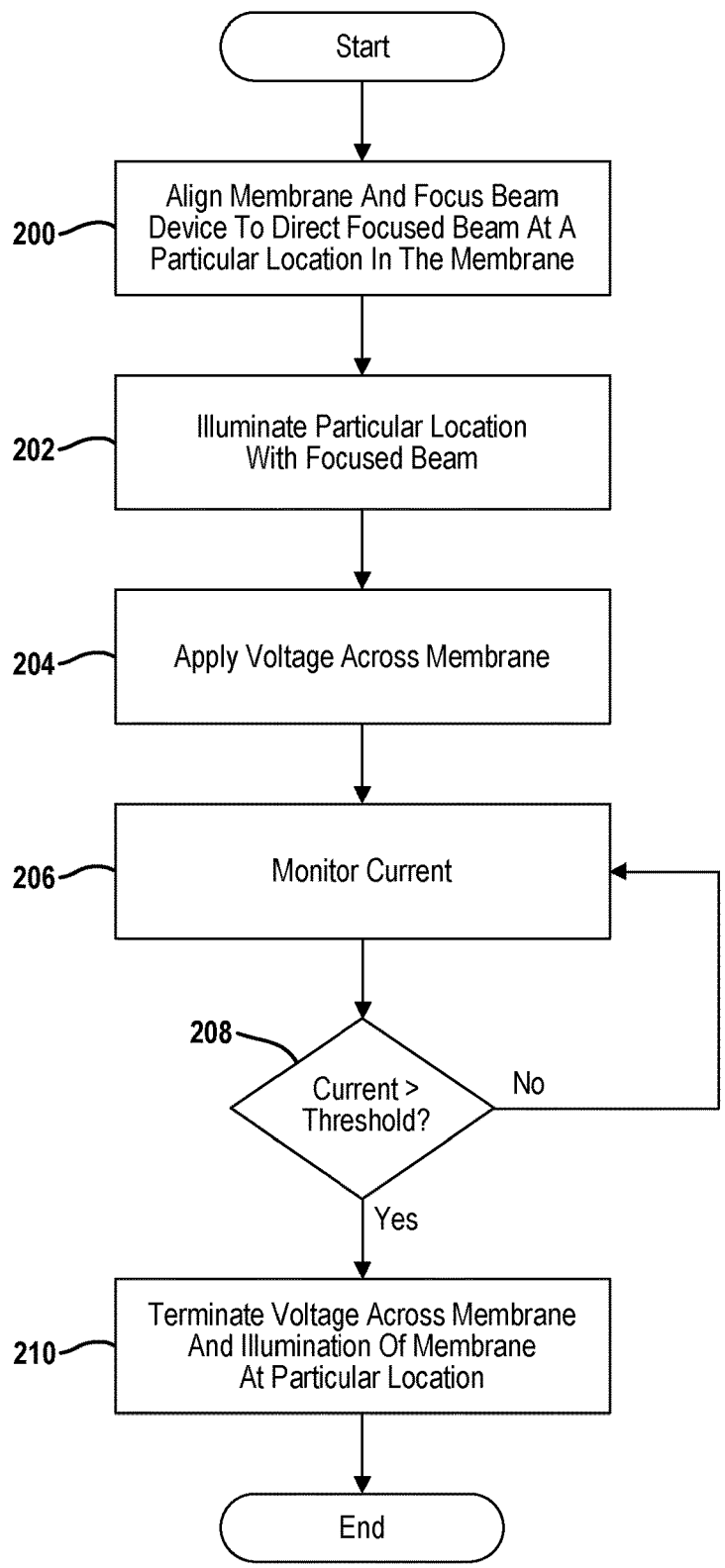
FIG. 3 is a flowchart depicting a method for fabricating a nanopore using the laser-enhanced controlled breakdown technique.

With reference to FIG. 3, an example method for forming a nanopore at a particular location using LECBD is provided. The method controls the dielectric strength of the membrane to form a nanopore at a particular location of the membrane. To control the dielectric strength, the membrane 116 and the focus beam device 104 are aligned, at 200, such that a light beam emitted by the focus beam device 104 illuminates a particular location of the membrane 116. The focus beam device 104 emits the light beam to illuminate the particular location of the membrane 116, at 202.

With the membrane 116 illuminated at the particular location, the method, at 204, applies a voltage across the membrane 116 to generate a high enough electric field to induce a leakage current across the membrane 116. Current flow across the membrane is monitored, at 206, while the electric field is being applied and the membrane 116 is being illuminated. The electric potential is selected to induce an electric field in the membrane, such that the electric field has a value greater than one tenth of the dielectric strength of the membrane or electric field that has a value greater than 0.1 volt per nanometer.

The creation of a single nanopore (i.e., fluidic channel spanning the membrane) is indicated by an abrupt irreversible increase in the leakage current. To detect the creation of the nanopore, the monitored current is compared to a predetermined threshold, at 208. When the monitored current exceeds the threshold, the voltage applied to the membrane 116 and the illumination of the membrane 116 at the particular location are terminated at 210. While reference is made to formation of a nanopore, the techniques described herein are applicable more generally to holes of varying sizes.

In the example embodiment, an electric potential is applied to the membrane and a leakage current, as an electrical property of the membrane, is monitored. Alternatively, an electric current may be applied to the membrane and a voltage level, as an electrical property of the membrane, may be monitored. In addition, in the example embodiment, the laser beam is aligned with the membrane before the electric potential/electric current is applied. Alternatively, the electric potential/electric current may be applied to the membrane prior to the laser beam being directed to and illuminating a particular location on the membrane.

In some embodiments, the electric potential is removed from the membrane 116 before the abrupt increase in the leakage current (i.e., before pore formation). For example, the electric potential is removed after the monitored current exceeds a predefined threshold or after a specified amount of time but before the abrupt increase in leakage current. In this way, the pore may be partial drilled or formed in the membrane. The same or different process can then be used at a subsequent time to complete pore formation.

Illuminating a selected area of the membrane with a focused beam (e.g., laser beam) generates electron-hole pairs, effectively increasing the conductivity in the illuminated region. The particular wavelength of light used can be tuned to maximize the photoconductivity in a particular material. For example, FIG. 4 illustrates a table of optimal wavelengths for various materials to directly excite electrons above the bandgap. We note that a laser source with less energy than the bandgap can also be used, since while it doesn't have enough energy to excite an electron directly across the bandgap, it might still promote an electron to a trap inside the bandgap and from the trap to the conduction band. That is, the electron hole pair generation might occur in multiple steps. The increased conductivity results in locally enhanced leakage current and strongly favors nanopore formation in the laser-illuminated portion of the membrane during the CBD process.

As way of further explanation, in a process known as photoconductivity, absorption of electromagnetic radiation, such as that of laser light, by a material excites electrons across its bandgap, thereby generating electron-hole pairs. The increasing number of free electrons and electron holes alters the material's electrical properties; effectively locally increasing its conductivity and creating a preferred path for leakage current. Enhanced leakage current through the laser-illuminated region locally increases the rate at which current generates defects in the membrane; providing highly favorable conditions for nanopore formation at the laser spot on the membrane. Thus, a nanopore can be generated at a particular location on the membrane by using the focused beam of a laser to illuminate the particular location where the pore is desired. We note also that illumination of a dielectric membrane can induce metastable changes in the density of traps or in the charge of the native traps, leading to an increased photoconductivity.

In general, the precision with which the nanopore is localized on the membrane depends on how tightly the laser beam is focused; down to a diffraction-limited spot roughly in the ~500-nm range depending on the focusing optics and the wavelength of light used. However, because a Gaussian laser beam has its intensity maximum in the center, the nanopore can be located with sub-diffraction-limit precision, since the photoconductivity effect is strongest at the very center of the beam where intensity is maximal.

Under high electric field, there may exist a local rate D of defects generated per unit area per unit time in the membrane, which is responsible for CBD. The local rate is directly proportional to the leakage current density passing the membrane, as provided in expression (1), where $\rho(\vec{r})$ is the local leakage current density.

$$D(\vec{r},t) = a\rho(\vec{r}) \tag{1}$$

Since nanopores can be formed anywhere with equal probability in the absence of laser illumination, it may be assumed that there exists a background current density for a given voltage, as provided in expression (2).

$$D_0 = a\rho_0 \tag{2}$$

Once the laser is turned on and the photon energy is greater than the bandgap of the membrane, electrons will be excited and photocurrent will be generated with photocurrent density proportional to the local laser intensity $I(\vec{r})$. The rate of defect generation can thus be provided in the following expression (3). The rate of defect generation per unit area within the laser illuminated spot will then be greater than the background defect generation rate by a factor provided in the expression (4).

$$D(\vec{r}) = \alpha[\rho_0 + \beta I(\vec{r})] = D_0 + \alpha\beta I(\vec{r}) \tag{3}$$

$$\frac{D(\vec{r})}{D_0} = 1 + \frac{\beta I(\vec{r})}{\rho_0} \tag{4}$$

Note that while it is not explicitly noted, all of the quantities above depend on time as current causes cumulative damage to the material. With a Gaussian laser profile with beam waist $w_0$, the rate of defect formation is then enhanced by a factor provided in expression (5), where r is measured from the center of the beam.

$$\frac{D(\vec{r})}{D_0} = 1 + \frac{\beta}{\rho_0} I_0 \exp\left(-\frac{2r^2}{w_0^2}\right) \tag{5}$$

Breakdown occurs once a critical density of defects exists at any point in the membrane. Since $\alpha, \beta$, and $\rho_0$ are material parameters which are independent of laser intensity, it is always possible to ensure, with high enough laser intensity, that the likelihood of that point existing within the laser spot is greater than the likelihood of it forming anywhere else on the membrane. Moreover, because the defect density generation rate depends sensitively on the distance from the center of the laser spot, it is possible in principle to localize the nanopore formation with sub-diffraction precision.

For a given laser intensity the photocurrent should eventually become independent of voltage or electric field strength during fabrication (i.e. saturate) as voltage (electric field) increases, while the background leakage current density will continue to increase, so higher intensities are necessary to have a significant effect on the position of nanopore formation for higher voltages (or higher electric fields). Moreover, since $\rho_0$ is an increasing function of voltage applied, using lower voltages (or electric fields) is expected to result in increased localization reliability.

Figures 5A, 5B:
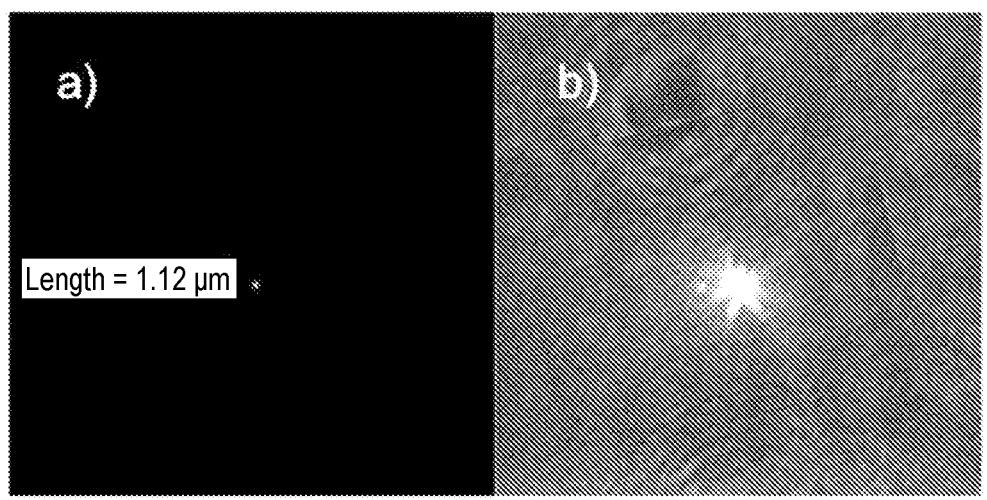
FIGS. 5A and 5B are digital images depicting a spot size of a light beam.

As an example, FIGS. 5A and 5B are digital images that depicted reduced laser spot size to enhance resolution of localized pore formation. In particular, using the apparatus described above, a laser beam of 488 nm is focused by adjusting the distance between two lenses in the microscope such that the illumination region is reduced, thereby forming a diffraction-limited spot. Digital images obtained by optical microscopy reveal the effective reduction in the spot size of the focused laser beam. FIG. 5A is an image with intensities ranging from 0 to 1000a.u. and FIG. 5B is the same image with intensity adjusted to range from 0 to 20a.u. to enable visualization of the 50×50-$\mu m^2$ membrane. The laser power was 0.1 mW when the images were taken.

Figure 6:
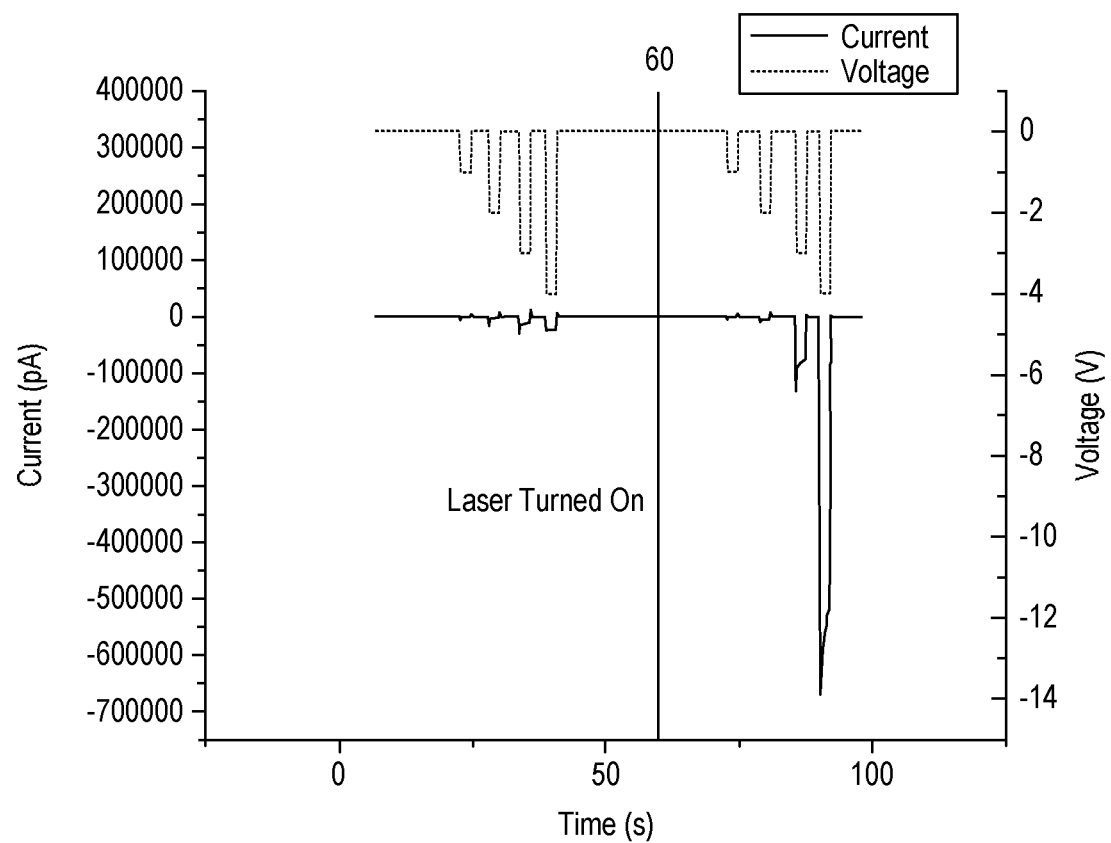
FIG. 6 is a graph depicting the effects on a leakage current through a SiN membrane.

With reference to FIG. 6, the effect of membrane illumination on leakage (tunneling) current through the SiN membrane is dramatic. The left side of the graph shows the current response of the SiN membrane to four voltage pulses of increasing magnitude (1V, 2V, 3V, 4V). The right side of the graph shows the current response of the same membrane to the same voltage pulses during illumination with the focused laser beam at 30 mW.

The voltage applied across a membrane and its leakage current response is initially plotted without laser illumination. The same voltage pulses are then repeated with concurrent laser illumination of a ~1-μm diameter region on the SiN membrane. At higher applied voltages (e.g., >2V), the leakage current increases significantly during laser illumination. The notable increase in measured current values produced by laser illumination draws a link between localized pore formation and the photoconductive effect of a laser beam during controlled breakdown, and shows that the dominant contribution to the leakage current comes from the laser-illuminated area. It also demonstrates that leakage current density is locally highly enhanced at the laser spot, since the background current without the laser also includes contributions from the support chip as well, where nanopores cannot form. In order for a diffraction-limited area to contribute so strongly to the total current, the local current density must be drastically increased by laser illumination.

Figure 7A:
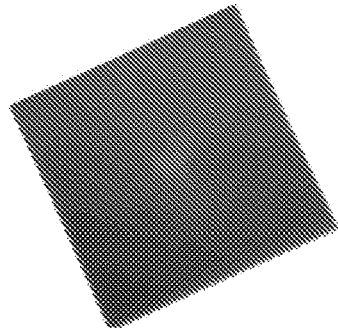
FIGS. 7A to 7F are optical images depicting nanopore fabrication using the laser-enhanced controlled breakdown technique.
Figure 7B:
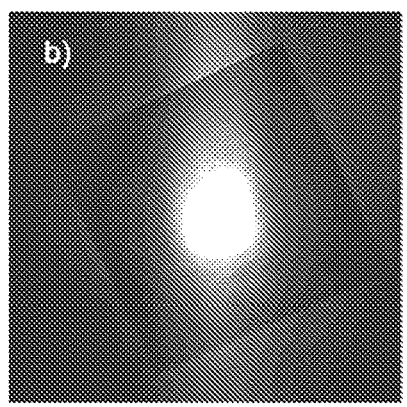
Figure 7C:
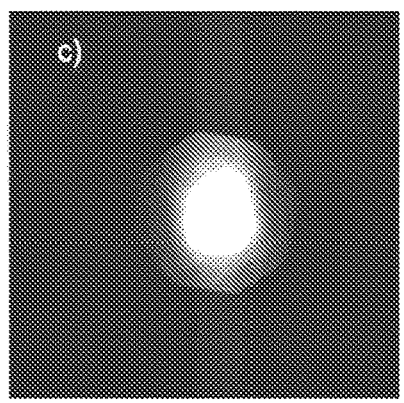
Figure 7D:
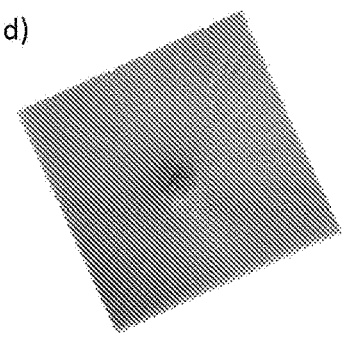
Figure 7E:
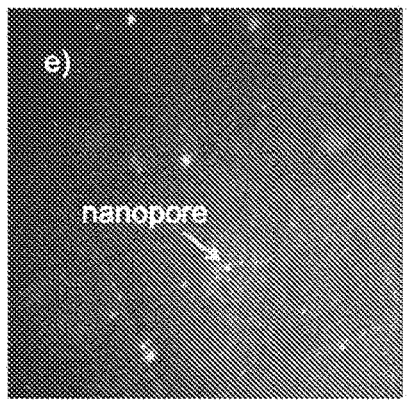
Figure 7F:
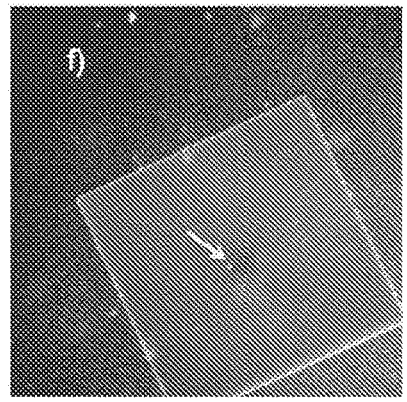

Despite the fact that scattered laser light illuminated nearly the entire 50 μm×50 μm area of the SiN membrane, the Gaussian profile of the beam intensity resulted in a point of greatest light intensity (orders of magnitude higher) at the beam center, maximizing photoconductivity enhancement. As shown in FIGS. 7A-7F, when a voltage is applied across the membrane during LECBD, leakage current is maximized at this laser-illuminated spot, followed by formation of a nanopore in the same precise location. FIGS. 7A and 7D are optical images obtained by wide field microscope using halogen lamps. FIGS. 7B and 7C are optical images obtained by a wide field microscope using a 488 nm laser. FIGS. 7E and 7F are optical images obtained by a fluorescence microscope.

FIG. 7A depicts the native SiN membrane immersed in 1M KCl prior to pore formation. FIG. 7B depicts the same membrane illuminated by a 488-nm laser beam spot focused to a somewhat large spot (~10-μm). FIG. 7C depicts the effects of a diaphragm used to limit laser illumination to the SiN membrane. FIG. 7D depicts the membrane following LECBD pore formation at high laser power (~30 mW). Note that features on the membrane are observed after the fabrication procedure 7D with respect to FIG. 7A. DNA labelled with YOYO-1 fluorescent dye clogs the nanopore, revealing its location under laser illumination (all other bright spots have been confirmed to move over time and DNA capture has been observed at the nanopore site). In FIG. 7F, the optical microscope image of the nanopore in FIG. 7D is superimposed with the fluorescence image of the pore location of FIG. 7E to clearly demonstrate the correlation between the membrane features observed following laser-enhanced CBD and confirmed pore localization.

In the demonstration depicted in FIGS. 7A-7F, a 30-mW laser intensity was used, which created features on the membrane after the nanopore fabrication. Nanopore fabrication by LECBD was also performed by lower laser power (e.g. 2 mW), which generated no observable features on the membrane following fabrication by LECBD. The location of the nanopore is ascertained by optically observing the capture and translocation of lambda DNA dyed with YOYO-1 fluorescent dyes, and is confirmed to correspond with the center of the laser-illuminated spot during nanopore fabrication by LECBD.

The laser-enhanced controlled breakdown technique of the present disclosure can be used to localize formation of a nanopore on a membrane by CBD. As described above, a focused laser beam hitting a membrane, which is immersed in electrolyte solution and exposed to a high electric field, induces increased localized leakage current and enhances rates of defect formation in the membrane at the laser spot. The laser beam greatly augments the likelihood of nanopore fabrication at that position on the membrane. The likelihood per unit area of fabricating a nanopore at the center of the laser spot hitting the membrane increases with increasing laser intensity. Lower values of the high electric fields used for fabrication are expected to result in increased localization reliability under appropriate laser illumination, since the photocurrent in the membrane will be the prevalent contribution to the overall leakage current.

Under low-electric field conditions (e.g. <0.5V/nm for SiN membranes, or <5V for a 10-nm SiN membrane in neutral 1M KCl), an array of nanopores can be fabricated by controlling the position of the focused beam on the membrane surface. Moving the focused beam away from the position once the first breakdown has occurred terminates the nanopore fabrication and growth at that position, while triggering the fabrication of a second nanopore at the new laser beam position. This process can be repeated until the desired array size is obtained. The terms "high electric field" and "low electric fields" are material dependent. Generally, a "low field" may refer to fields less than one tenth of the dielectric strength, and a "high field" may refer to fields that are on the order of the dielectric strength of the material.

As an example, after one nanopore is formed at a first location, the focus beam device stops illuminating the first location by turning off the light source and/or blocking the light beam by way of the shutter member. The focus beam device and the membrane are then aligned such that the light emitted by the beam device illuminates a second location. The position of the focus beam device and the membrane may be adjusted in various suitable ways including but not limited to adjusting a position of the moveable stage upon which the membrane is positioned and/or adjusting an optical direction of the light beam by way of the microscope. With the second position aligned with the focus beam device, the second position is illuminated with the focused beam and the voltage is applied across the membrane. The formation of the second nanopore at the second location is monitored based on the current across the membrane, as discussed above. Accordingly, multiple nanopores may be formed in the membrane at predetermined locations.

Under the same principle, illuminating a given nanopore in an array can also be used to increase the given nanopore to a desired size while not affecting the size of the other nanopores in the array. For example, a membrane having multiple nanopores may be illuminated at the location having the given nanopore. As electric potential is applied across the membrane, the size of the given nanopore may increase while the other nanopores are unchanged.

Nanopore fabrication by LECBD may also be influenced by the change in surface charge density of the membrane surface when under illumination by modulating the rate of charge transfer at the electrolyte/membrane interface and thus, the magnitude of the leakage current.

Nanopore fabrication by LECBD can further be influenced by the local heating of the membrane by the focused beam affecting the dielectric strength of the membrane material. Tuning the repetition rate of a pulsed laser could be used to induce local heating or on the contrary avoid heating on the membrane.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for fabricating a nanopore at a particular location in a membrane comprised of at least one dielectric material, the method comprising:
    directing a laser beam onto the particular location on the membrane while applying one of an electric potential or an electric current to the membrane;
    monitoring an electrical property across the membrane while one of the electric potential or the electric current is being applied across the membrane;
    detecting an abrupt change in the electrical property across the membrane while one of the electric potential or the electric current is being applied across the membrane; and
    removing the electric potential or the electric current from the membrane in response to detecting the abrupt change in the electrical property.

2. The method of claim 1 further comprises removing the laser beam from the particular location on the membrane in response to detecting the abrupt change in the electrical property across the membrane.

3. The method of claim 1 wherein the one of the electric potential or the electric current is applied after the laser beam is directed onto the particular location on the membrane.

4. The method of claim 1 wherein the laser beam is directed onto the particular location on the membrane after the one of the electric potential or the electric current is applied.

5. The method of claim 1 further comprises directing the laser beam onto a second location on the membrane and thereby forming a second nanopore in the membrane, where the second location differs from the particular location.

6. The method of claim 1 wherein, with an electric potential being applied to the membrane, the electrical property being monitored is a leakage current, and the detecting the abrupt change in the electrical property further comprises detecting an abrupt increase in the leakage current across the membrane.

7. The method of claim 6 wherein the detecting the abrupt increase in the leakage current further comprises determining a rate of change of the leakage current and comparing the rate of change to a threshold, and the electric potential is removed when the rate of change of the leakage current is greater than the threshold, thereby stopping the fabrication of a nanopore.

8. The method of claim 6 wherein the detecting the abrupt increase in the leakage current further comprises comparing a value of the leakage current to a threshold, and the electric potential is removed when the value of the leakage current is greater than the threshold, thereby stopping the fabrication of a nanopore.

9. The method of claim 1 wherein, with an electrical current being applied to the membrane, the electrical property being monitored is a voltage across the membrane, and the detecting the abrupt change in the electrical property further comprises detecting an abrupt decrease in the voltage across the membrane.

10. The method of claim 1 further comprises:
    disposing the membrane between two reservoirs filled with a fluid containing ions, such that the membrane separates the two reservoirs and prevents the fluid from passing between the two reservoirs;
    placing an electrode into each of the two reservoirs; and
    generating the one of the electric potential or the electric current using the electrodes.

11. The method of claim 1 further comprises:
    disposing the membrane between two reservoirs filled with a fluid containing ions, such that the membrane separates the two reservoirs and prevents the fluid from passing between the two reservoirs;
    placing an electrode in direct contact with the membrane; and
    generating the one of the electric potential or the electric current using the electrodes.

12. A method for fabricating a nanopore at a particular location in a membrane, the method comprising:
    directing a laser beam from a light source onto a surface of the membrane at the particular location on the membrane, wherein the membrane is comprised of at least one dielectric material;
    applying one of an electric potential or an electric current to the membrane;
    measuring an electrical property across the membrane while the one of the electric potential or the electric current is being applied to the membrane and the laser beam is being directed at the particular location, wherein the electrical property includes at least one of voltage or leakage current;
    comparing value of the measured electrical property to a threshold; and
    removing the one of the electric potential or the electric current to the membrane and removing the laser beam from the particular location on the membrane in response to the value of the measured electrical property exceeding the threshold.

13. The method of claim 12 further comprises selecting a wavelength for the laser beam based on material composition of the membrane.

14. The method of claim 12 wherein the one of the electric potential or the electric current is applied after the laser beam is directed onto the particular location on the membrane.

15. The method of claim 12 wherein the laser beam is directed onto the particular location on the membrane after the one of the electric potential or the electric current is applied.

16. The method of claim 12 wherein the electrical property includes the leakage current across the membrane when an electrical potential is applied to the membrane, and the comparing value of the measured electrical property further comprises determining a rate of change of the leakage current and comparing the rate of change, as the value, to the threshold, and the electric potential and the laser beam are removed when the rate of change of the leakage current is greater than the threshold, thereby stopping the fabrication of a nanopore.

17. The method of claim 12 wherein the electrical property includes the leakage current across the membrane when an electrical potential is applied to the membrane, and the electric potential and the laser beam are removed when the value of the leakage current is greater than the threshold, thereby stopping the fabrication of the nanopore.

18. The method of claim 12 wherein the electrical property includes the voltage across the membrane when an electrical current is applied to the membrane, and the electrical current and the laser beam are removed when the value of the voltage is less than the threshold, thereby stopping the fabrication of the nanopore.

19. The method of claim 12 further comprises:
disposing the membrane between two reservoirs filled with a fluid containing ions, such that the membrane separates the two reservoirs and prevents the fluid from passing between the two reservoirs;
placing an electrode into each of the two reservoirs; and
generating the one of the electric potential or the electric current using the electrodes.

20. The method of claim 12 further comprises:
disposing the membrane between two reservoirs filled with a fluid containing ions, such that the membrane separates the two reservoirs and prevents the fluid from passing between the two reservoirs;
placing an electrode in direct contact with the membrane; and
generating the one of the electric potential or the electric current using the electrodes.

21. The method of claim 12 wherein, to form a plurality of the nanopores at predetermined locations on the membrane, at each of the predetermined locations, the laser beam is directed onto the surface of the membrane at the predetermined location on the membrane, the one of the electric potential or the electric current is applied to the membrane, the electrical property across the membrane is measured while the one of the electric potential or the electric current is being applied to the membrane and the laser beam is being directed at the predetermined location, the measured electrical property is compared to a threshold, and the one of the electric potential or the electric current and the laser beam are removed in response to the value of the measured electrical property exceeding the threshold.

22. The method of claim 12 wherein the directing the laser beam further comprises:
controlling a positional alignment between the membrane and the laser beam by controlling an optical direction of the laser beam, and
activating the light source to emit the laser beam toward the surface of the membrane at the particular location on the membrane.

23. The method of claim 12 wherein the directing the laser beam further comprises:
controlling a positional alignment between the membrane and the laser beam by adjusting a position of the membrane with respect to the light source; and
activating the light source to emit the laser beam toward the surface of the membrane at the particular location on the membrane.

24. An apparatus for fabricating a nanopore in a membrane that is comprised of at least one dielectric material, the apparatus comprising:
a fluidic device including two reservoirs, at least two electrodes, and a holder, wherein:
the reservoirs hold fluid that contains ions, the membrane separates the two reservoirs and prevents the fluid from passing between the two reservoirs,
the electrodes are electrically connected to a power source and are operable to apply one of an electric potential or an electric current to the membrane, and
the holder is configured to hold the membrane that is immersed in the fluid from the two reservoirs and includes a window that provides optical access to the membrane;
an optical device operable to emit a focused laser beam passing through the window of the holder and directed toward a particular location on the membrane, wherein the focused laser beam illuminates the particular location of the membrane as the one of the electric potential or the electric current is being applied to the membrane by the electrodes;
a sensor electrically coupled to one of the electrodes and operable to measure an electrical property across the membrane, wherein the electrical property includes at least one of voltage and leakage current; and
a controller interfaced with the sensor, wherein the controller detects an abrupt change in the measured electrical property and, in response to detecting the abrupt change in the measured electrical property, removes the one of the electric potential or the electric current applied to the membrane and removes the focused laser beam from the particular location on the membrane.

25. The apparatus of claim 24 wherein a wavelength for the focused laser beam is based on material composition of the dielectric material of the membrane.

26. The apparatus of claim 24 wherein the optical device is an inverted optical microscope.

27. The apparatus of claim 24 wherein one electrode of the at least two electrodes is disposed in each of the two reservoirs.

28. The apparatus of claim 24 wherein the at least two electrodes are in direct contact with the membrane.

29. The apparatus of claim 24 wherein:
the electrodes apply an electric current to the membrane,
the sensor measures a voltage across the membrane, as the electrical property, and
the controller compares the measured voltage to a threshold and removes the electric current to the membrane and the focused laser beam from the particular location on the membrane in response to the voltage being less than the threshold.

30. The apparatus of claim 24 wherein:
the electrodes apply an electric potential to the membrane,
the sensor measures a leakage current across the membrane, as the electrical property, and
the controller compares the measured leakage current to a threshold and removes the electric potential to the membrane and the focused laser beam from the particular location on the membrane in response to the measured leakage current being greater than the threshold.

* * * * *